(12) United States Patent
Berhorst et al.

(10) Patent No.: US 7,319,368 B2
(45) Date of Patent: Jan. 15, 2008

(54) METHOD AND CIRCUIT ARRANGEMENT FOR LOAD MODULATION IN A COMBINATION COMPRISED OF A TRANSMITTING AND A RECEIVING OSCILLATOR CIRCUIT

(75) Inventors: Martin Berhorst, Heilbronn (DE); Peter Schneider, Hassmersheim (DE)

(73) Assignee: Atmel Germany GmbH, Heilbronn (DE)

( * ) Notice: Subject to any disclaimer, the term of this patent is extended or adjusted under 35 U.S.C. 154(b) by 134 days.

(21) Appl. No.: 11/111,827

(22) Filed: Apr. 22, 2005

(65) Prior Publication Data
US 2005/0237123 A1 Oct. 27, 2005

(30) Foreign Application Priority Data
Apr. 22, 2004 (DE) .................. 10 2004 020 816

(51) Int. Cl.
*H03B 5/12* (2006.01)
(52) U.S. Cl. .............. 331/117 R; 340/10.1; 340/572.5; 342/44
(58) Field of Classification Search ........ 340/10.1, 340/572.5; 342/44; 331/117 R
See application file for complete search history.

(56) References Cited
U.S. PATENT DOCUMENTS 4,333,072 A   6/1982  Beigel
5,864,580 A   1/1999  Lowe et al.
6,147,605 A * 11/2000 Vega et al. .............. 340/572.7
6,211,799 B1  4/2001  Post et al.
6,650,226 B1* 11/2003 Wuidart et al. ............ 340/10.1
6,762,683 B1* 7/2004  Giesler .................... 340/572.8
6,831,562 B2* 12/2004 Rodgers et al. .......... 340/572.4

FOREIGN PATENT DOCUMENTS

| DE | 31 49 789 C1 | 8/1983 |
| DE | 39 12 497 A1 | 10/1990 |
| EP | 1 477 927 A1 | 11/2004 |
| FR | 2 751 149 A1 | 1/1998 |

\* cited by examiner

*Primary Examiner*—Robert Pascal
*Assistant Examiner*—James Goodley
(74) *Attorney, Agent, or Firm*—Geissler, Olds & Lowe, PLLC

(57) ABSTRACT

A method and circuit arrangement is provided for load modulation in a receiving oscillator circuit, which can be mutually coupled with a transmitting oscillator circuit, having at least one inductance, at least one capacitance, and at least one controllable impedance. The controllable impedance can have at least one depletion layer element and at least one ohmic resistance.

15 Claims, 4 Drawing Sheets

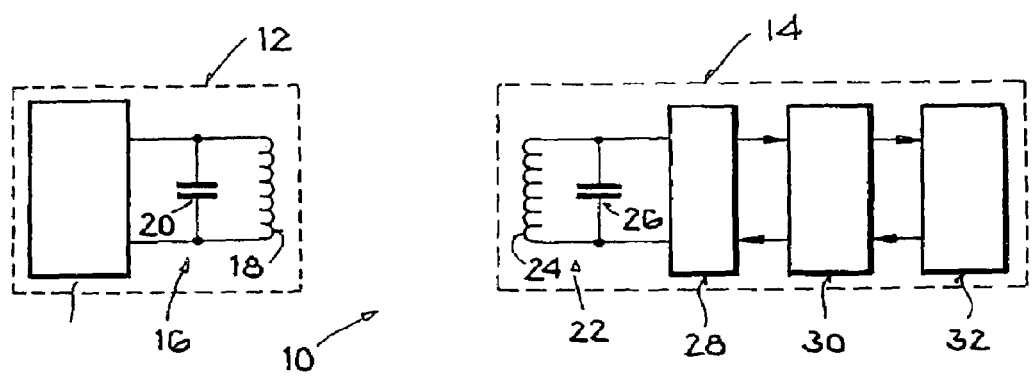
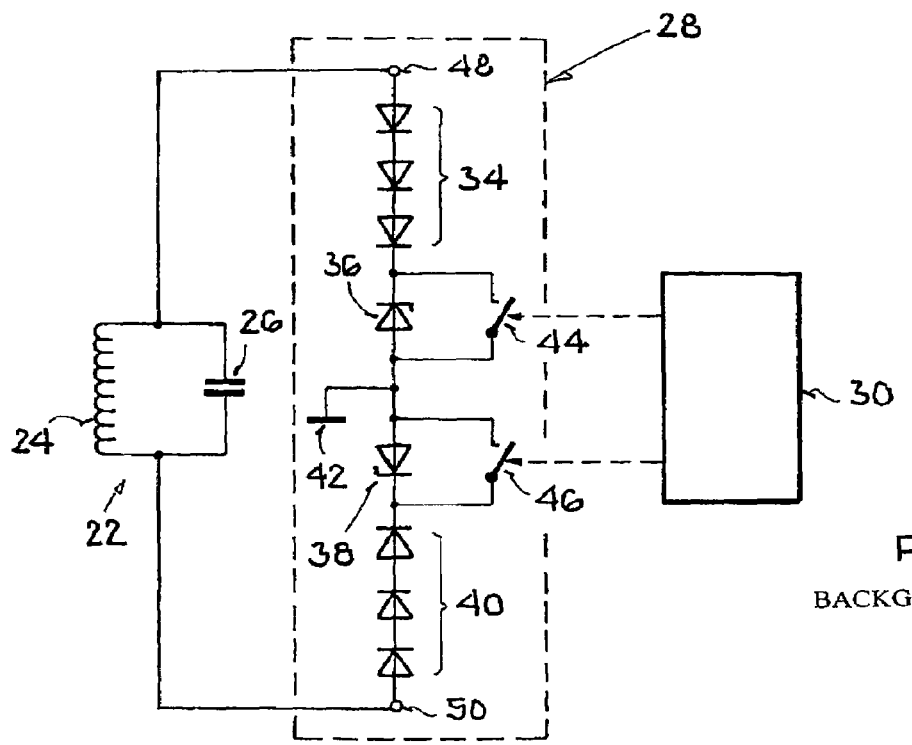
FIG. 1
FIG. 2
BACKGROUND ART

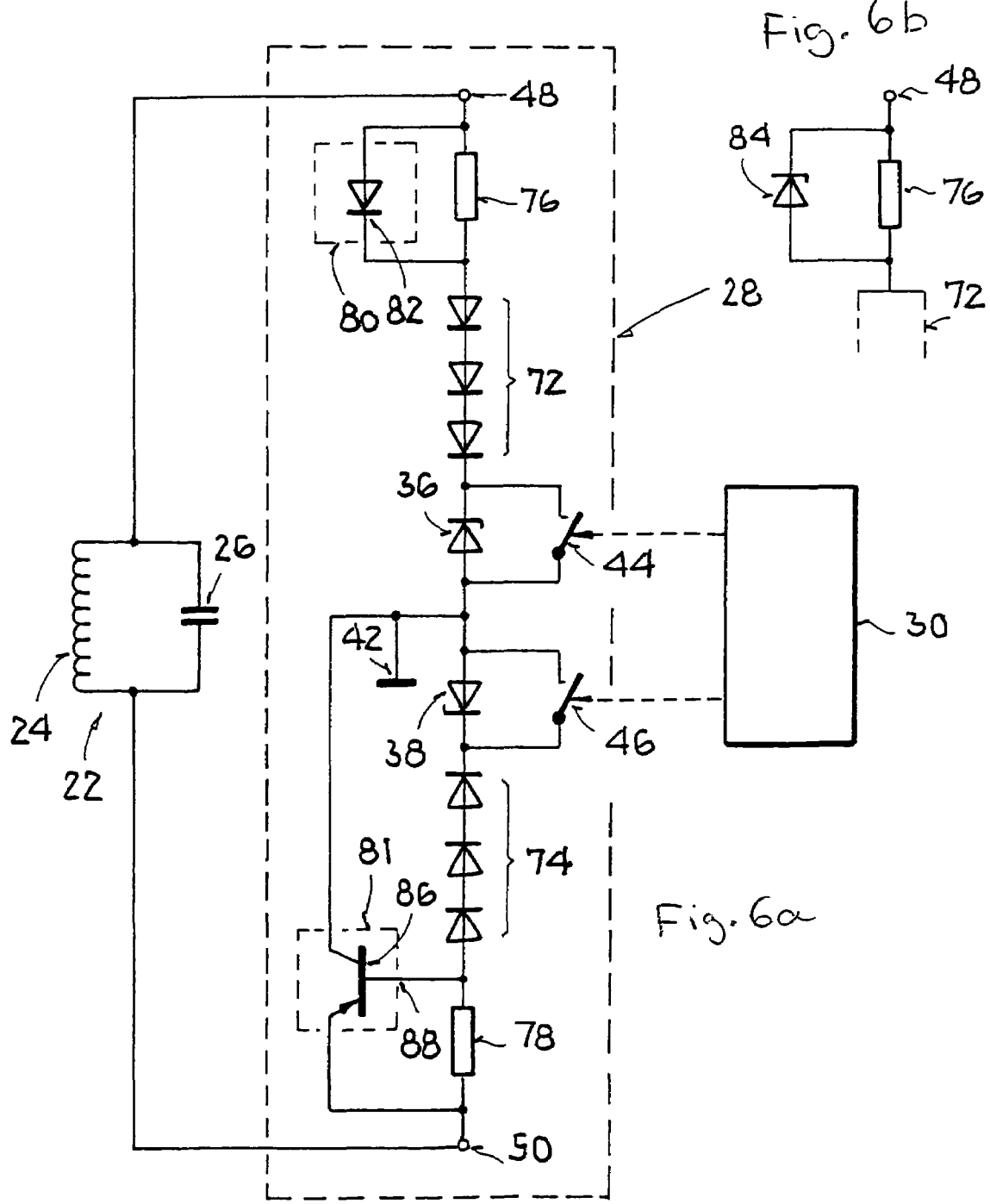

METHOD AND CIRCUIT ARRANGEMENT FOR LOAD MODULATION IN A COMBINATION COMPRISED OF A TRANSMITTING AND A RECEIVING OSCILLATOR CIRCUIT

This nonprovisional application claims priority under 35 U.S.C. § 119(a) on German Patent Application No. DE 102004020816.6, which was filed in Germany on Apr. 22, 2004, and which is herein incorporated by reference.

BACKGROUND OF THE INVENTION

1. Field of the Invention

The present invention relates to a method for load modulation in a combination comprised of a transmitting oscillator circuit and a receiving oscillator circuit, whereby a voltage on a transmitting oscillator circuit is modulated by retroaction of a voltage change in a receiving oscillator circuit.

Furthermore, the invention is directed to a circuit arrangement for load modulation in a receiving oscillator circuit, which can be mutually coupled with a transmitting oscillator circuit, having at least one inductance, one capacitance, and one controllable impedance.

2. Description of the Background Art

A method and circuit arrangement, particularly from RFID (Radio Frequency Identification) applications, have been known per se. In this document, every application, where a transmitting oscillator circuit supplies an inductively coupled receiving oscillator circuit with energy and, as the case may be, reads data via the receiving oscillator circuit, can be considered an RFID application. Combinations such as these are used, for example, for object identification, whereby via a receiving oscillator circuit, a transmitting oscillator circuit of a reader responds to an object marked with a so-called tag and retrieves information.

To establish contact, the transmitting oscillator circuit of the reader creates a high-frequency magnetic field, which induces an alternating voltage in an inductance of a receiving oscillator circuit, which is located in close proximity to a reader. The alternating voltage induced in the receiving oscillator circuit is demodulated and serves, for example, as energy supply for an integrated circuit connected to the receiving oscillator circuit. Furthermore, a clock frequency is derived from the induced alternating voltage, which is available to the integrated circuit, that is, for example, a microprocessor and/or a storage element for a system clock. By complementing the inductance of the transmitting oscillator circuit and/or the receiving oscillator circuit with capacitances, particularly with capacitances that are parallel to oscillator circuits, resonance effects are produced, which substantially improve the efficiency of the energy transfer.

The transmission of data from the reader to the receiving oscillator circuit (downlink) can be effected, for example, by activating and deactivating the magnetic field. For data transmission in a reverse direction from the receiving oscillator circuit to the reader, a load modulation can be used, which presupposes a sufficient proximity (distance less than 0.16* wavelength) of the transmitting and the receiving oscillator circuit. With sufficient proximity, a so-called mutual coupling occurs, whereby the energy absorption of the receiving coil is realized in voltage alterations in the transmitting oscillator circuit due to retroaction on the transmitting oscillator circuit. Controlled modulations of the load, namely, the impedance of the receiving oscillator circuit, thus create voltage alterations in the transmitting oscillator circuit, which can be evaluated for data transmission.

With the quality of the inductances used in the receiving oscillator circuit ever improving, in other words, with an increasing ratio between reactance and active resistance, the attenuation of the oscillator circuit and the width of the resonance curve decrease. In other words, the use of better-quality coils results in greater frequency selectivity and, with the voltage on the reader side unchanged, a higher voltage on the tag side, which increases the range of the communications connection.

In this context, it is known per se to reduce, or limit, the voltage of the receiving oscillator circuit to certain values (terminal voltages) by reversing or switching between two voltages within the framework of the modulation. This is done by inserting depletion layer elements between oscillator circuit terminals and a reference potential, or mass potential. For example, a lower terminal voltage is realized when the forward voltage above the depletion layer elements drops, whereby in a first approximation, the voltage drop is independent from the current due to the exponential dependence of the current from the voltage. In other words, unlike with ohmic resistance, the voltage drop is not linear with the current flow but remains approximately at the level of the forward voltage, even at higher current intensities.

As a result, the depletion layer elements act as a reliable restriction of the voltage of the oscillator circuit to a corresponding value, even at high coil voltage. This is of particular importance with systems that have high-quality inductances, which at close spatial proximity of the transmitting oscillator circuit and the receiving oscillator circuit could otherwise cause undesirably high voltages.

The second, upper terminal voltage can be realized with, for example, a Zener diode having a reversed forward direction and connected in series that can be controlled or connected to short circuit. In the short-circuit mode, the described restriction is on the lower terminal voltage, whereas in a non-short circuit mode, the breakdown voltage of the Zener diode provides an additional voltage offset, which in sum with the aforementioned forward voltages defines an upper terminal voltage. In a mode, when the Zener diode is short-circuited, a comparatively large flow emerges from the receiving oscillator circuit, which corresponds with the loaded mode of the oscillator circuit. The current drain from the oscillator circuit as well as the demand on the oscillator circuit from opening the short circuit via the Zener diode is decreased accordingly.

With these known load modulations, the following problem has been observed: When at the activation of the modulation a high coil current is being induced, that is, when the oscillator circuit voltage on the lower terminal voltage is restricted, the coil current could leak via the Zener-diode by-pass and into the remaining depletion layer elements that are switched in a forward direction, whereby the voltage of the oscillator circuit can fall below the terminal voltage and even below a threshold value that is used for the detection of oscillations (pulses) of the voltage of the oscillator circuit. That is to say, at unfavorable phase conditions, it can happen that when the load is turned on, the voltage of the transmitting oscillator circuit drops below a detection threshold for one or several periods due to retroaction, which falsifies the information transmission. This can result in a loss of data during information transmission to the reader.

If, during a high-induced coil current, the modulation is turned on, the depletion layer elements assure a restriction of the oscillating current voltage to a value that is predetermined by the depletion layer elements. In this phase, the diodes have the effect of a direct-current source and thus do not attenuate the coil current sufficiently so that the induced oscillation is altered. This results in a widening of the straight-fitting clock pulse phase (pulse widening), which leads to at least a partial cancellation of the sequential oscillation. This is manifested in that at least one oscillation in the amplitude is not large enough for a preset detection threshold.

SUMMARY OF THE INVENTION

It is therefore an object of the present invention to provide a method and a circuit arrangement that at least minimizes the afore-mentioned disadvantages.

This task is solved in a method and circuit arrangement of the conventional art in that a load modulation is performed by a controlled alteration of an impedance of an oscillator circuit that has at least one depletion layer element and one ohmic resistance.

Due to a linear current/voltage dependence, a finite, current-dependent voltage drops across an ohmic resistance during a current flow. In contrast thereto, the depletion layer element tendentiously restricts the voltage drop, even at higher current intensities, current-independently to about the output strength of the forward voltage so that its effect is similar to a direct current source. It has been found that this combination of depletion layer elements and ohmic resistances in particular has the advantage of reliable voltage restriction without the described disadvantage of information loss due to unfavorable conditions when the load modulation is turned on.

The alteration of the oscillator circuit impedance can be accomplished by controlled bridging of at least one depletion layer element and/or the ohmic resistance.

Both options result in a defined impedance alteration, which transfers to the transmitting oscillation circuit due to an inductive transformer feedback, and which can therefore be used for data transmission from the tag to the reader.

In regards to: embodiments of the circuit arrangement, the controllable impedance can be positioned between a first oscillator circuit connection and a reference potential.

The potential on the oscillator circuit connection can be linked via the controllable impedance to the reference potential, and is thus, in a way, restricted to defined values that depend on the value of the impedance, which allows a reproduction of reliable data transmission by load modulation.

The controllable impedance can include a first controllable impedance between the first oscillator circuit connection and the reference potential, and a second controllable impedance between a second oscillator circuit connection and the reference potential.

The arrangement of a circuit for clamping the oscillator circuit potentials to predetermined values produces the previously mentioned advantages at an intensified scale because it provides predetermined restrictions of the positive and negative deviations of the oscillation circuit potentials from the reference potential.

A further example embodiment has the benefit of a symmetric arrangement and structure of the first controllable impedance and the second controllable impedance to the reference potential.

This symmetric structure has the effect that oscillations are sign-independent and evenly influenced, and are restricted to the same range of deviations from the reference potential. This, too, increases the reliability of the data transmission.

The controllable impedance, in addition, can include, a switchable by-pass of at least one depletion layer element and/or the ohmic resistance.

With the switchable by-pass, a load modulation with little expenditure is realized.

Furthermore, the switchable by-pass can include an operating current path of a transistor.

This provides a particularly easily controllable and monolithicly integratable version of a load modulation.

Also, the controllable impedance can have at least one series connection of a first depletion layer element and an ohmic resistance.

If an ohmic resistance is series-connected to the depletion layer elements, the resistance attenuates the coil current, provided it is of an appropriate dimensional design, to a degree that the aforementioned pulse widening, and thus also the partial cancellation, will be at least reduced. Therefore, all oscillation amplitudes are sufficiently high, which allows them to cross over the preset detection thresholds.

In addition to the first depletion layer, the series connection can also have at least a second depletion layer element, which is in line with the first depletion layer element, and which has a forward conduction direction that is opposite the forward conduction direction of the first depletion layer element.

This allows the voltage of the oscillator circuit in load modulation to be restricted to defined values in both circuit modes. As long as both depletion layer elements are not by-passed, a current flow occurs when the sum of the breakdown voltage of one depletion layer element and the forward voltage of the other depletion layer element is exceeded. In contrast, when the depletion layer element is bridged, the current flow occurs when the forward voltage is exceeded. The difference between the forward voltage and the sum of forward voltage and breakdown voltage thus defines the modulation stroke of the load modulation in the receiving oscillator circuit.

In yet another example embodiment, a Zener diode is used as a first and second depletion layer element.

Zener diodes have the advantage that they can be permanently operated in the area of the breakdown voltage.

The controllable impedance can include a parallel circuit connection having at least one semiconductor component and one ohmic resistance.

With an arrangement such as this, the desired properties are further optimized. The disadvantage, that is, undesirably high voltages across the resistance that occur at great flows, is avoided due to the parallel-positioned depletion layer element that restricts the occurring voltage to the value of its forward voltage.

In a further example embodiment, a third depletion layer element can be a diode.

As an alternative, a transistor can be used as a third depletion layer element that is controlled by a voltage drop in the ohmic resistance, and the operating current path of which bypasses at least the ohmic resistance.

The operating current path of the transistor can be located between an oscillator circuit connection and a reference potential.

This alternative has the distinct advantage that the current flows via the operating current path directly to the reference potential, that is, for example, to a substrate connection. It no longer flows into the chain of additional units of first and second depletion layer elements, which as a result can be made of smaller dimensional design.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 1 is a system comprising a reader and a circuit arrangement with a receiving oscillator circuit;

FIG. 2 is a conventional receiving oscillator circuit with elements for load modulation;

FIGS. 6a,b show a second example embodiment of a section of a circuit arrangement according to the present invention.

DETAILED DESCRIPTION

Figure 3:
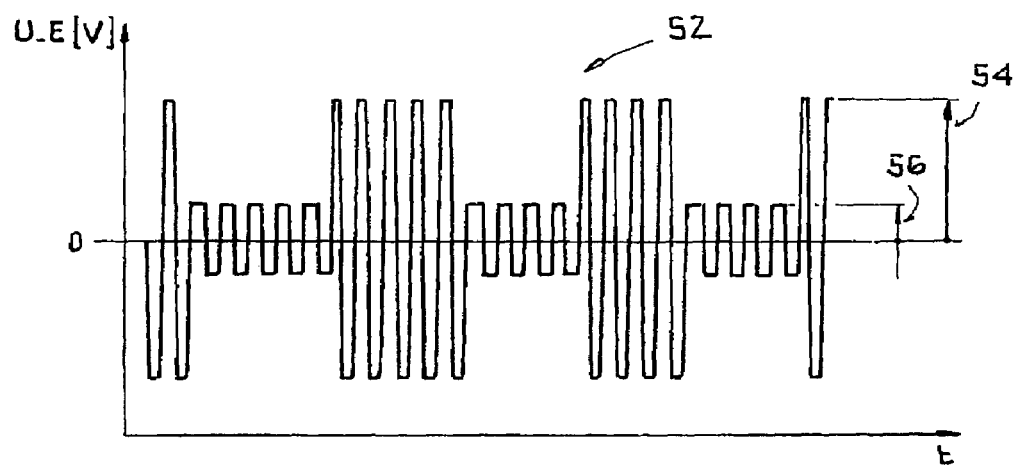
FIG. 3 illustrates a desired modulation response.

FIG. 1 illustrates a complete system 10 comprising a reader 12 and a receiving part 14, for example, an object marker (tag). The reader 12 has a transmitting oscillator circuit 16, which in the schematic illustration in FIG. 1 includes inductive elements 18 and capacitive elements 20. The receiving part 14 has a receiving oscillator circuit 22, which also has at least one inductance 24 and one capacitance 26. In addition, the receiving part 14 has an interface 28 and optionally, a control circuit 30 and/or a memory storage 32.

FIG. 2 shows the receiving oscillator circuit 22 together with details of a conventional interface 28. Parallel to the parallel oscillator circuit 22 having an inductance 24 and a capacitance 26, a series connection comprised of upper first diodes 34, a Zener diode 36, an additional Zener diode 38 and lower first diodes 40 is positioned. Between the Zener diodes 36, 38 is a reference potential connection 42, which provides a mass potential for the circuit, for example. The Zener diodes 36, 38 can be by-passed by switches 44, 46, which are operated by a control circuit 30. The switches 44, 46 are preferably realized as transistors, in particular, as MOS transistors.

The upper first diodes 34 and the lower first diodes 40 are used solely for the restriction of a voltage of the oscillator circuit between the connections 48, 50 of the receiving oscillator circuit 22, when switches 44 and 46 are closed, and define a lower protective voltage level. In this mode, each of the diodes 34, 40 limit at a time when a potential difference between the reference potential connection 42 and one of the connections 48, 50 exceeds a sum of the forward voltages of the diodes 34 or 40. Thus, when the Zener diodes 36, 38 are bridged, the voltage of the oscillator circuit is restricted by this sum of the forward voltages so that typically, a value of 3*0.7=2.1 volts for each of the three diodes 34, 40 is achieved.

In contrast, when the switches 44, 46 are open, the potential difference between the connection 42 and one of the connections 48, 50, respectively, must additionally exceed a breakdown voltage of the Zener diodes 36, 38 before the voltage of the oscillator circuit is restricted to a higher level. With switches 44, 46 open, and assuming a breakdown voltage of 7 volts, this restriction is 2.1 volts+7 volts=9.1 volts. This value defines an upper protective voltage level.

By opening and closing the switches 44, 46, the control circuit 30 modulates the value of the maximum oscillator circuit voltage and thus the impedance of the receiving oscillator circuit 22. As previously mentioned, this modulation of the impedance of the receiving oscillator circuit emerges as the modulation of the load of the transmitting oscillator circuit 16 under the prerequisite of a mutual coupling (distance shorter than 0.16 times the wavelength) in the terminal voltage of the transmitting oscillator circuit 16, which can be used for the extraction of data from the receiving part 14.

FIG. 3 shows a desired course 52 of the resulting oscillator circuit voltage U_E in the receiving oscillator circuit 22 under the influence of such a controlled load modulation over the time span t. The amplitudes 54 are large when switches 44, 46 of FIG. 2 are open, and the amplitudes 56 are small when switches 44, 46 are closed, with which blocking Zener diodes 36, 38 of FIG. 2 are by-passed. With the values stated in connection with FIG. 2, the value of the small amplitude 56 is 2.1 volts, and the value of the larger amplitude 54 is approximately 9.1 volts.

Figure 4:
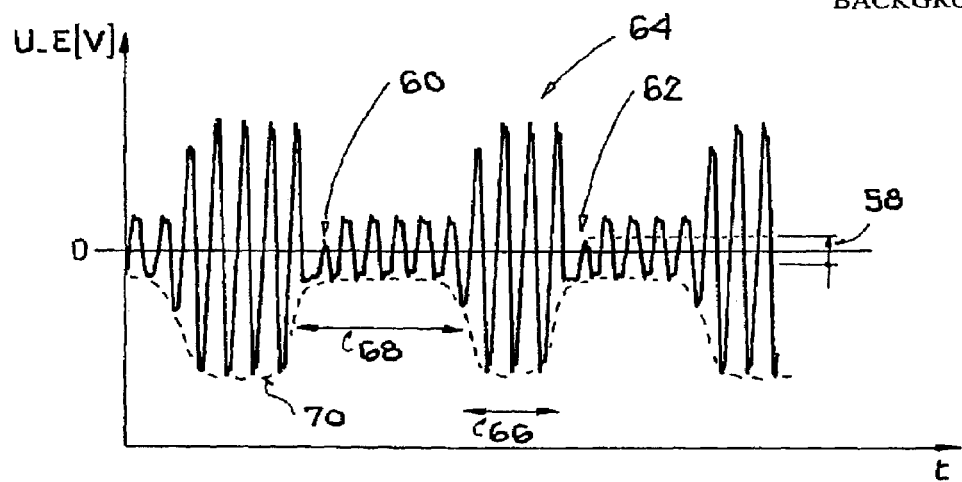
FIG. 4 illustrates a problematic modulation response, as it has been observed with conventional circuit arrangements in combination with high-quality receiving inductances.

In reality, however, an undesirable effect appears under unfavorable conditions, as illustrated in FIG. 4. If a high coil current is being induced when the load modulation is activated, that is, during the restriction of the oscillating current voltage U_E to the lower clamping level, then it is possible that it leaks across the by-pass of the Zener diode 36 or 38 and into the remaining depletion layer elements 34, 40 that are switched to a forward direction, whereby the voltage of the oscillator circuit U_E can temporarily drop below the clamping level and also below the threshold value 58, which is used for the detection of pulses of the oscillation circuit voltage U_E. In the illustration of FIG. 4, such insufficiently high pulses are marked with reference numerals 60, 62 in the U_E behavior 64.

Commonly, the control circuit 30 of the receiving part 14 counts the pulses and codes the information for the reader 12 through a variation of the length of high periods 66 and/or low periods 68 of the envelope curve 70 of the U_E behavior 64. In this context, "high" or "low," respectively, refer to the absolute value of the signal height. The reader 12 registers the length of these periods 66, 68 and reconstructs the read-out information therefrom. The erroneous non-registration of pulses by the receiving part 14 thus leads to a falsification of the information to be transmitted.

Figure 5:
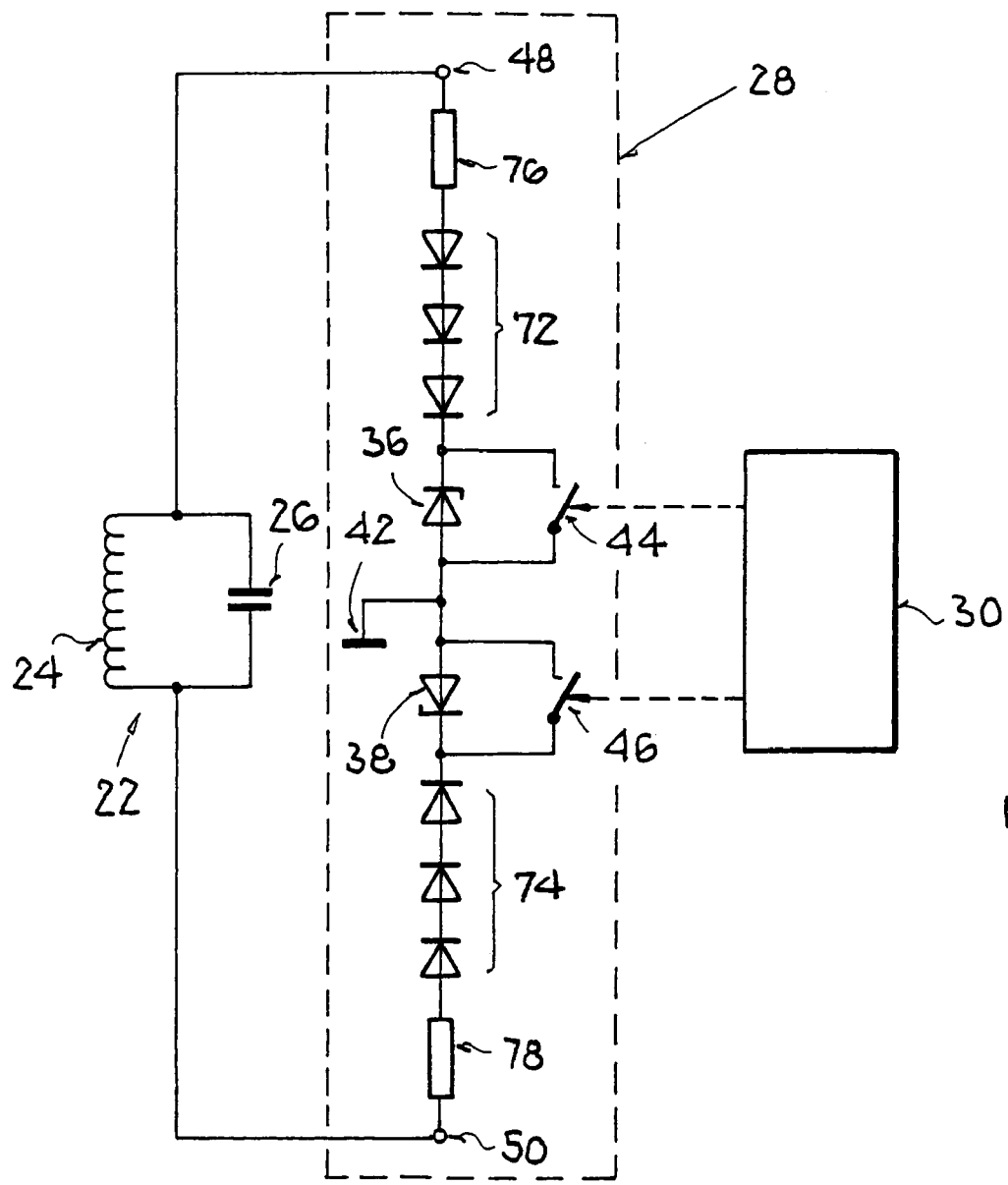
FIG. 5 shows a first example embodiment of a section of a circuit arrangement according to the present invention.

FIG. 5 shows a first example embodiment of a section of a circuit arrangement of the present invention, which makes it possible to at least reduce this falsification. The object of FIG. 5 is hereby based on the object of FIG. 3. What is new is that in addition to the first depletion layer elements 72, 74, at least one ohmic resistance 76 or 78 is positioned between an oscillator circuit connection 48, 50 and the reference potential connection 42. A current that flows across one of the ohmic resistances 76, 78, as a matter of course, entails a voltage drop across the corresponding resistance 76, 78. As a result, at least the voltage drop across this resistance 76 and/or 78 is built up, even when a modulation is activated under the aforementioned unfavorable conditions, which results in a reliable exceeding of detection thresholds 58 in FIG. 4, even in the case of a parallel oscillation build-up and activation of a load modulation. The depletion layer elements 72, 74 can correspond to the diodes 34, 40 of FIG. 3 and/or can be realized as base-emitter diodes of transistors with short-circuited collector-base junctions, for example.

FIGS. 6a,b illustrates a second example embodiment of a circuit section of the invention. The difference between the object of FIG. 6a and the object of FIG. 5 is, among others, that is has semiconductor components 80, 81, which restrict voltage drops on the resistances 76, 78. As previously mentioned, the resistances 76, 78 assure an evaluable amplitude of the oscillator circuit voltage at the oscillation build-up, even during critical activation of a load modulation. The disadvantage is that the large oscillator circuit flows, as they can occur in steady-state modes, for example, can produce undesirably big drops in voltage across the resistances 76, 78. In order to avoid this, the semiconductor components 80, 81 restrict the voltage drop across the resistances 76, 78.

The semiconductor component can be, for example, a diode 82, which is located parallel to the resistance 76, between an oscillator circuit connection 48 and the remaining elements of the series connection, that is, the first depletion layer elements 72 and the second depletion layer elements (Zener diodes) 36 of FIG. 5. This is illustrated for the semiconductor component 80 in FIG. 6a.

As an alternative, the semiconductor component 80 can be realized as a Zener diode 84, as is illustrated in FIG. 6b.

As a further alternative, the semiconductor component can also be realized as transistor 86, as is shown in FIG. 6a in combination with the resistance 78 for the illustration of the semiconductor component 81. In an example embodiment having transistor 86, the operating current path is advantageously switched between each one of the oscillator circuit connections 48, 50 and the reference potential connection 42, and a control connection 88 of the transistor 86 is connected to the resistance 76, 78. In FIG. 6a, an embodiment having a diode 82 across the resistance 76 and a transistor 86 across the resistance 78 is illustrated. It is to be understood, however, that the embodiment can also be symmetrical, whereby both resistances 76, 78 are complemented by homogeneous semiconductor components 80 or 81.

A sufficiently big voltage drop across the resistance 78 then controls/guides the operating current path of the transistor 86, which effectively restricts a current rise across the resistance 78 and thus the voltage drop across the resistance 78.

Because the operating current path is conducted directly to the reference potential connection 42, the current that by-passes the resistance 78 no longer leaks into the remaining chain of first and second depletion layer elements 74, 38, which, as a desired result, can be down-sized. It goes without saying that the transistor 86 can be an MOS transistor as well as a bipolar transistor.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for load modulation in a system comprising a transmitting oscillator circuit and a receiving oscillator circuit, the method comprising:
    modulating a voltage in the transmitting oscillator circuit by retroaction of a voltage alteration in the receiving oscillator circuit, wherein the receiving oscillator circuit comprises an inductor; and
    controllably changing a load modulation of an impedance of the receiving oscillator circuit that includes at least two depletion layer elements and at least one ohmic resistance,
    wherein at least one of the at least two depletion layer elements includes a parallel connection of a Zener diode and a bypass element.

2. The method according to claim 1, wherein the changing of the impedance of the receiving oscillator circuit is performed by controlled bridging of the at least two depletion layer elements and/or the at least one ohmic resistance.

3. A circuit arrangement for load modulation in a receiving oscillator circuit, which can be mutually coupled with a transmitting oscillator circuit, the circuit arrangement comprising:
    at least one inductor;
    at least one capacitor; and
    a controllable impedance including at least two depletion layer elements and at least one ohmic resistance, wherein at least one of the at least two depletion layer elements includes a parallel connection of a Zener diode and a bypass element.

4. The circuit arrangement according to claim 3, wherein the controllable impedance is located between a first oscillator circuit connection and a reference potential connection.

5. The circuit arrangement according to claim 4, wherein the controllable impedance includes a first controllable impedance between the first oscillator circuit connection and the reference potential connection, and includes a second controllable impedance between a second oscillator circuit connection and the reference potential connection.

6. The circuit arrangement according to claim 5, wherein an arrangement and structure of the first controllable impedance and the second controllable impedance is symmetric to the reference potential connection.

7. The circuit arrangement according to claim 3, wherein the controllable impedance further includes a switchable bypass formed of at least one depletion layer element and/or the ohmic resistance.

8. The circuit arrangement according to claim 7, wherein the switchable bypass includes an operating current path of a transistor.

9. The circuit arrangement according to claim 3, wherein the controllable impedance further includes at least one series connection of a first depletion layer element and the ohmic resistance.

10. The circuit arrangement according to claim 9, wherein, in addition to the first depletion layer element, the series connection further includes at least one second depletion layer element, which is in series with the first depletion layer element and has a forward direction that is opposite a forward direction of the first depletion layer element.

11. The circuit arrangement according to claim 10, wherein the second depletion layer element is a Zener diode.

12. The circuit arrangement according to claim 3, wherein the controllable impedance includes a parallel connection formed of at least one semiconductor component and at least one ohmic resistance.

13. The circuit arrangement according to claim 12, wherein the semiconductor component is a diode.

14. The circuit arrangement according to claim 12, wherein the semiconductor component is a transistor, which is controlled by a voltage drop in the ohmic resistance, and includes an operating current path that at least bridges the ohmic resistance.

15. The circuit arrangement according to claim 14, wherein the operating current path of the transistor is between an oscillator circuit connection and a reference potential connection.

* * * * *